(12) United States Patent
Deng

(10) Patent No.: US 11,056,035 B1
(45) Date of Patent: Jul. 6, 2021

(54) GATE ON ARRAY CIRCUIT WITH CAPACITORS CONNECTED IN PARALLEL

(71) Applicant: TCL CHINA STAR OPTOELECTRONICS TECHNOLOGY CO., LTD., Guangdong (CN)

(72) Inventor: Leilei Deng, Guangdong (CN)

(73) Assignee: TCL CHINA STAR OPTOELECTRONICS TECHNOLOGY CO., LTD., Guangdong (CN)

(*) Notice: Subject to any disclaimer, the term of this patent is extended or adjusted under 35 U.S.C. 154(b) by 0 days.

(21) Appl. No.: 16/768,675

(22) PCT Filed: May 21, 2020

(86) PCT No.: PCT/CN2020/091507
§ 371 (c)(1),
(2) Date: May 31, 2020

(30) Foreign Application Priority Data

May 6, 2020 (CN) .......................... 202010370615.9

(51) Int. Cl.
*G09G 3/34* (2006.01)
*G09G 3/36* (2006.01)
*G09G 3/20* (2006.01)

(52) U.S. Cl.
CPC ....... *G09G 3/20* (2013.01); *G09G 2300/0408* (2013.01); *G09G 2300/0852* (2013.01); *G09G 2310/0251* (2013.01); *G09G 2310/0267* (2013.01)

(58) Field of Classification Search
CPC ............. G09G 3/20; G09G 2300/0408; G09G 2300/0852; G09G 2310/0251; G09G 2310/0267
See application file for complete search history.

(56) References Cited

U.S. PATENT DOCUMENTS

| 2004/0178434 A1* | 9/2004 | Kato ................. G02F 1/133305 257/298 |
| 2010/0295154 A1* | 11/2010 | Riess ................. H01L 23/5223 257/532 |
| 2018/0293950 A1* | 10/2018 | Lv ........................ G09G 3/3677 |
| 2018/0336835 A1* | 11/2018 | Liu ....................... G09G 3/3677 |
| 2018/0336837 A1* | 11/2018 | Chen ....................... H01L 33/00 |
| 2020/0365106 A1* | 11/2020 | Xi ....................... G02F 1/13306 |

* cited by examiner

*Primary Examiner* — Kwang-Su Yang
(74) *Attorney, Agent, or Firm* — Mark M. Friedman

(57) ABSTRACT

A gate on array (GOA) circuit with capacitors connected in parallel includes a plurality of cascading GOA units. An $n^{th}$ GOA unit includes: a pull-up control circuit unit, a pull-up circuit unit, a pass-down circuit unit, a pull-down circuit unit, a pull-down maintaining circuit unit, and a bootstrap capacitor. The bootstrap capacitor is divided into a plurality of first capacitors connected in parallel. After a function of the first capacitor is lost due to small foreign objects or the insulating layer damaged, a connecting line of at least one of the first capacitors being unable to store is cut off.

9 Claims, 5 Drawing Sheets

GATE ON ARRAY CIRCUIT WITH CAPACITORS CONNECTED IN PARALLEL

FIELD

The present disclosure relates to display technologies, and more particularly, to a gate on array (GOA) circuit.

BACKGROUND

In existing display panel technologies, Application of the gate on array (GOA) circuit is widespread and deep. In order to improve clock signal transmission efficiency, a designed capacitor is pre-charged and pulled up so as to quickly pull up the $n^{th}$ level signal potential. The capacitor is usually formed as a whole of a first metal layer (M1), a second metal layer (M2), and an insulating layer interposed between the first metal layer (M1) and the second metal layer (M2).

With development of a panel industry, cost is reduced to improve product competitiveness, and the insulating layer tends to be thinner. In addition, in an actual production process, fine particles and film breakage will be generated during the film formation process, which will cause the capacitor to fail and affect a GOA function to lead to product scrap.

Therefore, the present invention provides a GOA circuit to solve the problem that capacitors fail due to fine particles and film breakage during film formation.

SUMMARY

In view of the above, the present disclosure provides a gate on array (GOA) circuit to provide a bootstrap capacitor divided into a plurality of first capacitors connected in parallel. After a function of the first capacitor is lost due to small foreign objects or the insulating layer damaged, a connecting line of at least one of the first capacitors being unable to store is cut off. An overall bootstrap capacitance function will not fail to avoid a loss of GOA circuit function due to a failure of the overall capacitor resulted from small foreign objects.

In order to achieve above-mentioned object of the present disclosure, one embodiment of the disclosure provides a GOA circuit, including a plurality of cascading GOA units. An $n^{th}$ GOA unit includes: a pull-up control circuit unit, a pull-up circuit unit, a pass-down circuit unit, a pull-down circuit unit 104, a pull-down maintaining circuit unit, and a bootstrap capacitor. All the pull-up control circuit unit, the pull-up circuit unit, the pass-down circuit unit, the pull-down circuit unit 104, the pull-down maintaining circuit unit, and the bootstrap capacitor are connected to a first node. The pull-up control circuit unit 101 is configured to receive an $(n-1)^{th}$ pass-down signal and an $(n-1)^{th}$ scan driving signal to pre-charge the first node. The pull-up circuit unit is configured to receive a clock signal to pull-up an electrical level of an $n^{th}$ scan driving signal. The pass-down circuit unit is configured to output an $n^{th}$ pass-down signal to control a pull-up control circuit unit of a $(n+1)^{th}$ GOA unit to turn on or off. The pull-down circuit unit is configured to receive an $(n+1)^{th}$ scan driving signal to pull-down the pre-charge electrical level of the first node Q(n) and an electrical level of the $n^{th}$ scan driving signal to a low power source. The pull-down maintaining circuit unit is configured to maintain the pre-charge electrical level of the first node Q(n) and the electrical level of the $n^{th}$ scan driving signal G(n) at the low power source and to keep unchanged. The bootstrap capacitor is configured to provide and to maintain the pre-charge electrical level of the first node, and the bootstrap capacitor includes a plurality of first capacitors connected in parallel, wherein a connecting line of at least one of the first capacitors being unable to store is cut off.

In one embodiment of the GOA circuit, the bootstrap capacitor 106 includes: a first metal layer, an insulating layer disposed on the first metal layer, and a second metal layer disposed on the insulating layer.

In one embodiment of the GOA circuit, patterns of the first metal layer and the second metal layer both are gridlike. Nodes of the grid of the first metal layer correspond to nodes of the grid of the second metal layer. The first metal layer, the insulating layer, and the second metal layer form the first capacitor at the nodes.

In one embodiment of the GOA circuit, patterns of the first metal layer and the second metal layer are both striplike. A strip of the first metal layer is perpendicular to a strip of the second metal layer. The first metal layer, the insulating layer, and the second metal layer form the first capacitor at a cross region at which a projection of the second metal layer projected on the first metal layer crosses the first metal layer.

In one embodiment of the GOA circuit, a pattern of the first metal layer is striplike. A pattern of the second metal layer includes a plurality of squares. The first metal layer, the insulating layer, and the second metal layer form the first capacitor at a cross region at which a projection of the second metal layer projected on the first metal layer crosses the striplike pattern.

In one embodiment of the GOA circuit, a pattern of the first metal layer includes a plurality of squares. A pattern of the second metal layer is striplike. The first metal layer, the insulating layer, and the second metal layer form the first capacitor at a cross region at which a projection of the striplike pattern projected on the first metal layer crosses the first metal layer.

In one embodiment of the GOA circuit, the pull-up control circuit unit includes a first thin film transistor. A gate of the first thin film transistor is configured to receive the $(n-1)^{th}$ pass-down signal. A source of the first thin film transistor connects with the first node Q(n). A drain of the first thin film transistor is configured to receive the $(n-1)^{th}$ scan driving signal.

In one embodiment of the GOA circuit, the pull-up circuit unit includes a second thin film transistor. A gate of the second thin film transistor connects with the first node. A drain of the second thin film transistor is configured to receive the clock signal. A source of the second thin film transistor is configured to receive the $n^{th}$ scan driving signal.

In one embodiment of the GOA circuit, the pass-down circuit unit includes a third thin film transistor. A gate of the third thin film transistor connects with the first node. A source of the third thin film transistor is configured to output the $n^{th}$ pass-down signal ST(n). A drain of the third thin film transistor is configured to receive the clock signal.

In one embodiment of the GOA circuit, the pull-down circuit unit includes a fourth thin film transistor and a fifth thin film transistor. A gate of the fourth thin film transistor is configured to receive the $(n+1)^{th}$ scan driving. A source of the fourth thin film transistor is configured to receive the low power source. A drain of the fourth thin film transistor is configured to receive the $n^{th}$ scan driving signal. A gate of the fifth thin film transistor is configured to receive the $(n+1)^{th}$ scan driving signal. A source of the fifth thin film transistor connects with the first node. A drain of the fifth thin film transistor is configured to receive the low power source.

In one embodiment of the GOA circuit. The pull-down maintaining circuit unit includes an inverter, a sixth thin film transistor, and a seventh thin film transistor. One end of the inverter connects with the first node. Another end of the inverter connects with a gate of the sixth thin film transistor and a gate of the seventh thin film transistor respectively. A source of the sixth thin film transistor is configured to receive the low power source. A drain of the sixth thin film transistor is configured to receive the $n^{th}$ scan driving signal. A source of the seventh thin film transistor is configured to receive the low power source. A drain of the seventh thin film transistor connects with the first node.

In comparison with prior art, the gate on array (GOA) circuit provides the bootstrap capacitor divided into a plurality of the first capacitors connected in parallel. After a function of the first capacitor is lost due to small foreign objects or the insulating layer damaged, the connecting line of at least one of the first capacitors being unable to store is cut off. An overall bootstrap capacitance function will not fail to avoid a loss of GOA circuit function due to a failure of the overall capacitor resulted from small foreign objects.

DETAILED DESCRIPTION

The following description of the embodiments is provided by reference to the drawings and illustrates the specific embodiments of the present disclosure. Directional terms mentioned in the present disclosure, such as "up," "down," "top," "bottom," "forward," "backward," "left," "right," "inside," "outside," "side," "peripheral," "central," "horizontal," "peripheral," "vertical," "longitudinal," "axial," "radial," "uppermost" or "lowermost," etc., are merely indicated the direction of the drawings. Therefore, the directional terms are used for illustrating and understanding of the application rather than limiting thereof.

Figure 1:
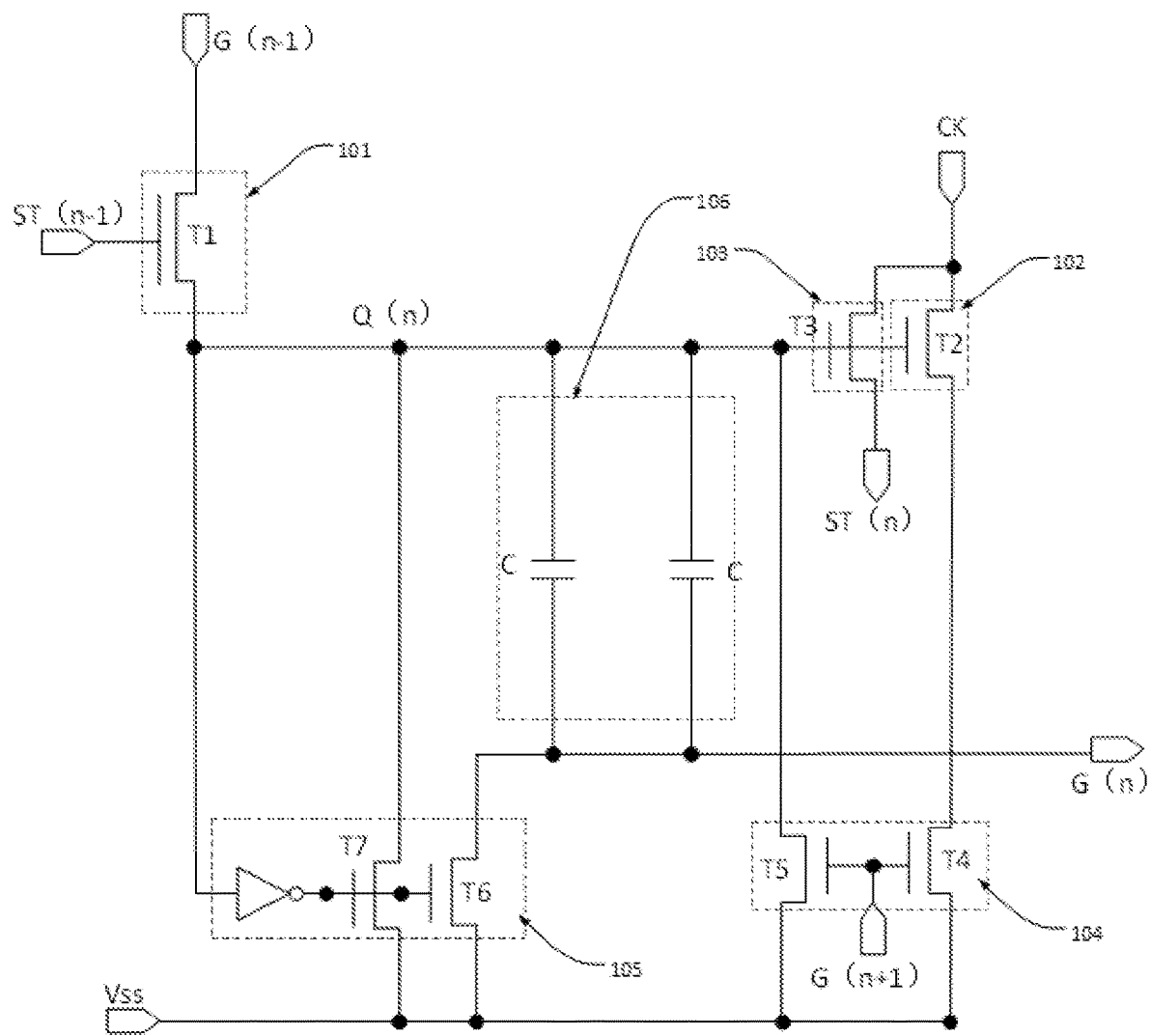
FIG. 1 is a schematic view of a GOA circuit according to an embodiment of the present disclosure.

Referring to FIG. 1, one embodiment of the disclosure provides a GOA circuit, including a plurality of cascading GOA units. An $n^{th}$ GOA unit includes: a pull-up control circuit unit 101, a pull-up circuit unit 102, a pass-down circuit unit 103, a pull-down circuit unit 104, a pull-down maintaining circuit unit 105, and a bootstrap capacitor 106.

All the pull-up control circuit unit 101, the pull-up circuit unit 102, the pass-down circuit unit 103, the pull-down circuit unit 104, the pull-down maintaining circuit unit 105, and the bootstrap capacitor 106 are connected to a first node Q(n).

The pull-up control circuit unit 101 is configured to receive an $(n-1)^{th}$ pass-down signal ST(n-1) and an $(n-1)^{th}$ scan driving signal G(n-1) to pre-charge the first node Q(n).

The pull-up control circuit unit 101 includes a first thin film transistor T1. A gate of the first thin film transistor T1 is configured to receive the $(n-1)^{th}$ pass-down signal ST(n-1). A source of the first thin film transistor T1 connects with the first node Q(n). A drain of the first thin film transistor T1 is configured to receive the $(n-1)^{th}$ scan driving signal G(n-1).

The pull-up circuit unit 102 is configured to receive a clock signal CK to pull-up an electrical level of an $n^{th}$ scan driving signal G(n).

The pull-up circuit unit 102 includes a second thin film transistor T2. A gate of the second thin film transistor T2 connects with the first node Q(n). A drain of the second thin film transistor T2 is configured to receive the clock signal CK. A source of the second thin film transistor T2 is configured to receive the $n^{th}$ scan driving signal G(n).

The pass-down circuit unit 103 is configured to output an $n^{th}$ pass-down signal ST(n) to control a pull-up control circuit unit of a $(n+1)^{th}$ GOA unit to turn on or off.

The pass-down circuit unit 103 includes a third thin film transistor T3. A gate of the third thin film transistor T3 connects with the first node Q(n). A source of the third thin film transistor T3 is configured to output the $n^{th}$ pass-down signal ST(n). A drain of the third thin film transistor T3 is configured to receive the clock signal CK.

The pull-down circuit unit 104 is configured to receive an $(n+1)^{th}$ scan driving signal G(n+1) to pull-down the pre-charge electrical level of the first node Q(n) and an electrical level of the $n^{th}$ scan driving signal G(n) to a low power source VSS.

The pull-down circuit unit 104 includes a fourth thin film transistor T4 and a fifth thin film transistor T5.

A gate of the fourth thin film transistor T4 is configured to receive the $(n+1)^{th}$ scan driving G(n+1). A source of the fourth thin film transistor T4 is configured to receive the low power source VSS. A drain of the fourth thin film transistor T4 is configured to receive the $n^{th}$ scan driving signal G(n).

A gate of the fifth thin film transistor T5 is configured to receive the $(n+1)^{th}$ scan driving signal G(n+1). A source of the fifth thin film transistor T5 connects with the first node Q(n). A drain of the fifth thin film transistor T5 is configured to receive the low power source VSS.

The pull-down maintaining circuit unit 105 is configured to maintain the pre-charge electrical level of the first node Q(n) and the electrical level of the $n^{th}$ scan driving signal G(n) at the low power source VSS and to keep unchanged.

The pull-down maintaining circuit unit 105 includes an inverter, a sixth thin film transistor T6, and a seventh thin film transistor.

One end of the inverter connects with the first node Q(n). Another end of the inverter connects with a gate of the sixth thin film transistor T6 and a gate of the seventh thin film transistor T7 respectively.

A source of the sixth thin film transistor T6 is configured to receive the low power source VSS. A drain of the sixth thin film transistor T6 is configured to receive the $n^{th}$ scan driving signal G(n).

A source of the seventh thin film transistor T7 is configured to receive the low power source VSS. A drain of the seventh thin film transistor T7 connects with the first node Q(n).

The bootstrap capacitor 106 is configured to provide and to maintain the pre-charge electrical level of the first node Q(n), and the bootstrap capacitor 106 includes a plurality of first capacitors C connected in parallel, wherein a connecting line of at least one of the first capacitors C being unable to store is cut off.

The bootstrap capacitor 106 includes: a first metal layer, an insulating layer, and a second metal layer. The insulating layer disposed on the first metal layer. The second metal layer disposed on the insulating layer.

The disclosure provides four types of patterns of the bootstrap capacitor from a first embodiment to a fourth embodiment.

Figure 2:
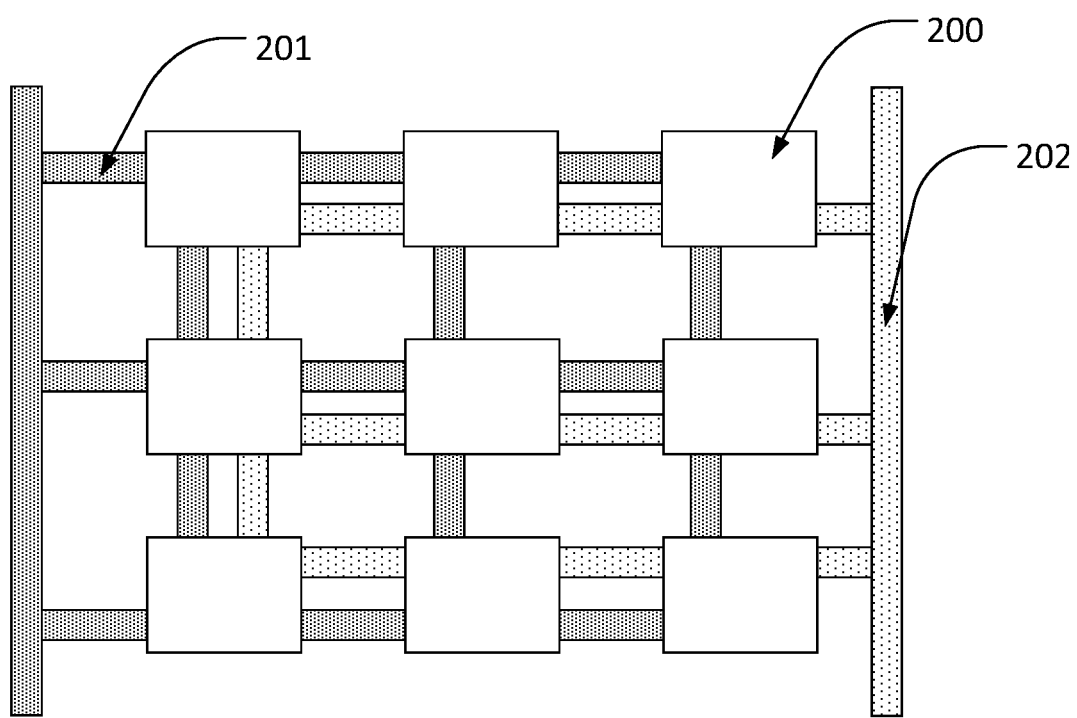
FIG. 2 is a schematic view of a structure of a pattern of a bootstrap capacitor according to a first embodiment of the present disclosure.
Figure 3:
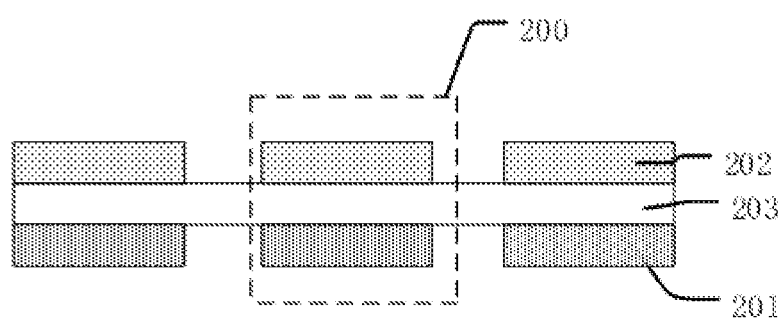
FIG. 3 is a schematic cross-sectional view of a node of a grid according to FIG. 2.

As shown in FIG. 2 and FIG. 3, in the first embodiment of the GOA circuit, patterns of the first metal layer 201 and the second metal layer 202 both are gridlike. Nodes of the grid of the first metal layer 201 correspond to nodes of the grid of the second metal layer 202. The first metal layer 201, the insulating layer 203, and the second metal layer 202 form the first capacitor at the nodes 200.

All fractions of the first metal layer 201 correspond to nodes of the grid. A upper metal fraction, a lower metal fraction, and the insulating layer between them are formed the first capacitor C.

If one of the first capacitors C is failure, one can cut the connecting line at the node corresponding to the failure capacitor.

Figure 4:
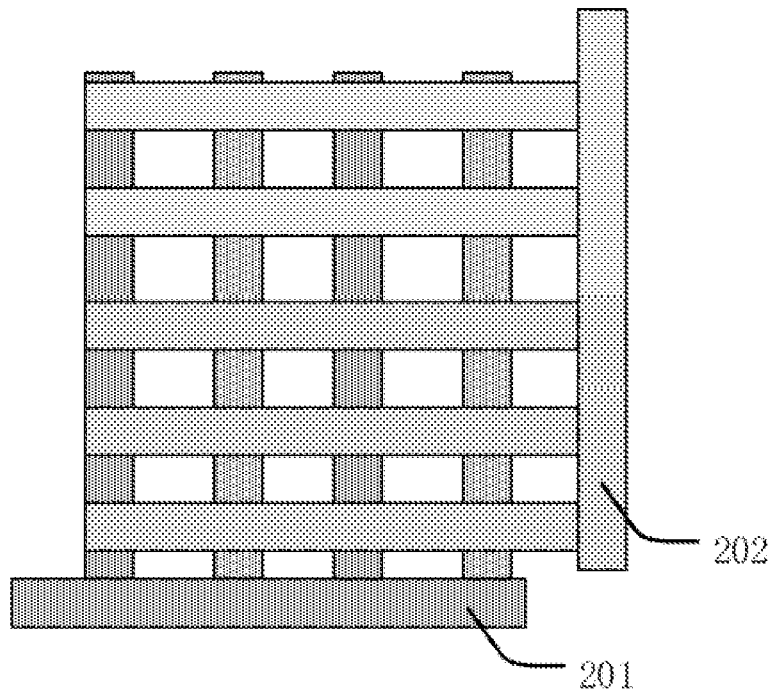
FIG. 4 is a schematic view of a structure of a pattern of a bootstrap capacitor according to a second embodiment of the present disclosure.

As shown in FIG. 4, in the fourth embodiment of the GOA circuit, patterns of the first metal layer 201 and the second metal layer 202 are both striplike. A strip of the first metal layer 201 is perpendicular to a strip of the second metal layer 202.

The first metal layer 201, the insulating layer, and the second metal layer 202 form the first capacitor at a cross region at which a projection of the second metal layer 202 projected on the first metal layer 201 crosses the first metal layer 201.

If one of the first capacitors C is failure, one can cut the strip of the first metal layer or the strip of the second metal layer at the cross region corresponding to the failure capacitor.

Figure 5:
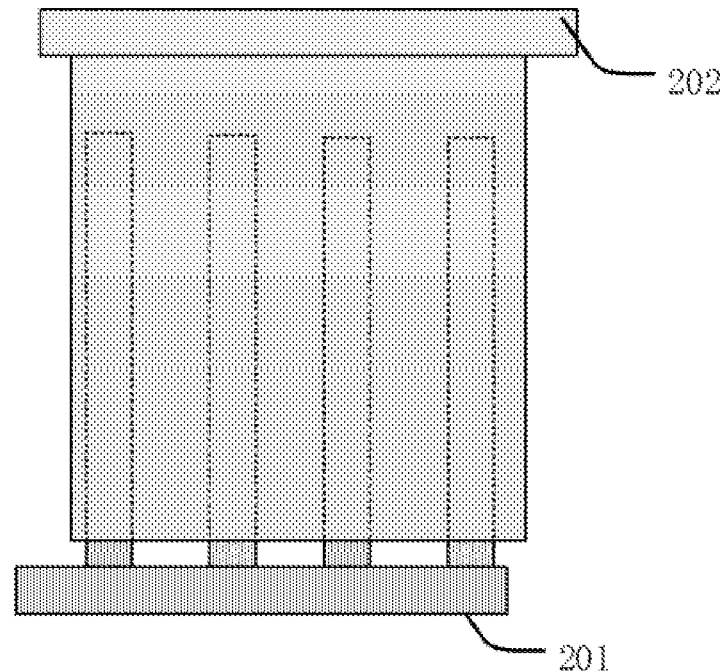
FIG. 5 is a schematic view of a structure of a pattern of a bootstrap capacitor according to a third embodiment of the present disclosure.

In the third embodiment of the GOA circuit, a pattern of the first metal layer 201 is striplike (shown as a dash line in FIG. 5). A pattern of the second metal layer 202 includes a plurality of squares. The first metal layer 201, the insulating layer, and the second metal layer 202 form the first capacitor at a cross region at which a projection of the second metal layer 202 projected on the first metal layer 201 crosses every one of the striplike patterns.

As shown in FIG. 5, when the pattern of the second metal layer 202 is a whole square, the second metal layer and the first metal layer need a staggered setting to preserve a cutting region of the strip.

Figure 6:
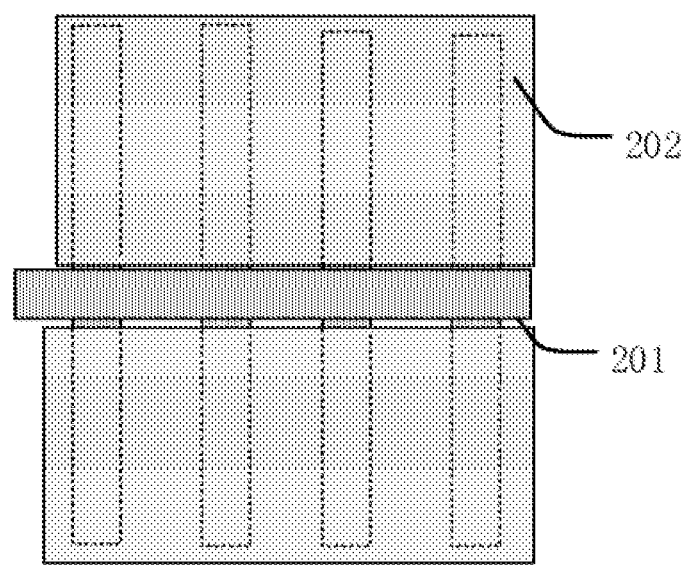
FIG. 6 is a schematic view of a structure of a pattern of a bootstrap capacitor according to the third embodiment of the present disclosure.

As shown in FIG. 6, when the pattern of the second metal layer 202 is at least two squares, the squares are staggered setting. The first metal layer includes a main trunk corresponding to an interval. The main trunk is perpendicular to every strip of the first metal layer.

In the fourth embodiment of the GOA circuit, a pattern of the first metal layer 201 includes a plurality of squares. A pattern of the second metal layer 202 is striplike. The first metal layer 201, the insulating layer, and the second metal layer 202 form the first capacitor at a cross region at which a projection of the striplike pattern projected on the first metal layer 201 crosses the first metal layer 201.

Figure 7:
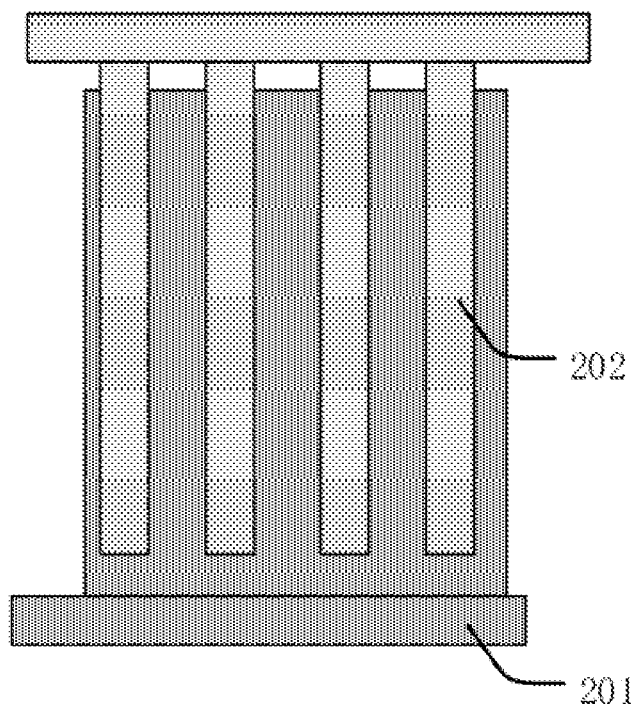
FIG. 7 is a schematic view of a structure of a pattern of a bootstrap capacitor according to a fourth embodiment of the present disclosure.

As shown in FIG. 7, when the pattern of the first metal layer 201 is a whole square, the second metal layer 202 and the first metal layer 201 need a staggered setting to preserve a cutting region of the strip.

Figure 8:
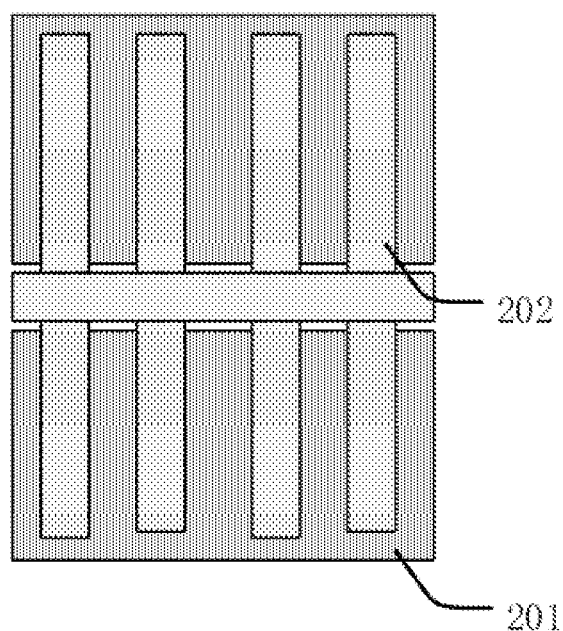
FIG. 8 is a schematic view of a structure of a pattern of a bootstrap capacitor according to the fourth embodiment of the present disclosure.

As shown in FIG. 8, when the pattern of the first metal layer 201 is at least two squares, the squares are staggered setting. The second metal layer includes a main trunk corresponding to an interval. The main trunk is perpendicular to every strip of the second metal layer.

In comparison with prior art, the gate on array (GOA) circuit provides the bootstrap capacitor divided into a plurality of the first capacitors connected in parallel. After a function of the first capacitor is lost due to small foreign objects or the insulating layer damaged, the connecting line of at least one of the first capacitors being unable to store is cut off. An overall bootstrap capacitance function will not fail to avoid a loss of GOA circuit function due to a failure of the overall capacitor resulted from small foreign objects.

The present disclosure has been described by the above embodiments, but the embodiments are merely examples for implementing the present disclosure. It must be noted that the embodiments do not limit the scope of the invention. In contrast, modifications and equivalent arrangements are intended to be included within the scope of the invention.

What is claimed is:

1. A gate on array (GOA) circuit, comprising a plurality of cascading GOA units, wherein an $n^{th}$ GOA unit comprises a pull-up control circuit unit, a pull-up circuit unit, a pass-down circuit unit, a pull-down circuit unit, a pull-down maintaining circuit unit, and a bootstrap capacitor,
   wherein: all the pull-up control circuit unit, the pull-up circuit unit, the pass-down circuit unit, the pull-down circuit unit, the pull-down maintaining circuit unit, and the bootstrap capacitor are connected to a first node Q(n);
   the pull-up control circuit unit is configured to receive an $(n-1)^{th}$ pass-down signal and an $(n-1)^{th}$ scan driving signal to pre-charge the first node;
   the pull-up circuit unit is configured to receive a clock signal to pull-up an electrical level of an $n^{th}$ scan driving signal;
   the pass-down circuit unit is configured to output an $n^{th}$ pass-down signal to control a pull-up control circuit unit of a $(n+1)^{th}$ GOA unit to turn on or off;
   the pull-down circuit unit is configured to receive an $(n+1)^{th}$ scan driving signal to pull-down the pre-charge electrical level of the first node and an electrical level of the $n^{th}$ scan driving signal to a low power source;
   the pull-down maintaining circuit unit is configured to maintain the pre-charge electrical level of the first node and the electrical level of the $n^{th}$ scan driving signal at the low power source and to keep unchanged; and
   the bootstrap capacitor is configured to provide and to maintain the pre-charge electrical level of the first node, and the bootstrap capacitor comprises a plurality of first capacitors connected in parallel, wherein a connecting line of at least one of the first capacitors being unable to store is cut off, and
   wherein: a pattern of a first metal layer is striplike, a pattern of a second metal layer comprises a plurality of squares, and the first metal layer, an insulating layer, and the second metal layer form the first capacitor at a cross region at which a projection of the second metal layer projected on the first metal layer crosses the striplike pattern; or the pattern of the first metal layer comprises a plurality of squares, and the pattern of the second metal layer is striplike, and the first metal layer, the insulating layer, and the second metal layer form the first capacitor at a cross region at which a projection of the striplike pattern projected on the first metal layer crosses the first metal layer.

2. The GOA circuit according to claim 1, wherein the bootstrap capacitor comprises:
the first metal layer;
the insulating layer disposed on the first metal layer; and
the second metal layer disposed on the insulating layer.

3. The GOA circuit according to claim 2, wherein patterns of the first metal layer and the second metal layer both are gridlike, nodes of the grid of the first metal layer correspond to nodes of the grid of the second metal layer, and the first metal layer, the insulating layer, and the second metal layer form the first capacitor at the nodes.

4. The GOA circuit according to claim 2, wherein:
patterns of the first metal layer and the second metal layer are both striplike, and a strip of the first metal layer is perpendicular to a strip of the second metal layer; and
the first metal layer, the insulating layer, and the second metal layer form the first capacitor at a cross region at which a projection of the second metal layer projected on the first metal layer crosses the first metal layer.

5. The GOA circuit according to claim 1, wherein
the pull-up control circuit unit comprises a first thin film transistor, a gate of the first thin film transistor is configured to receive the $(n-1)^{th}$ pass-down signal, a source of the first thin film transistor connects with the first node, and a drain of the first thin film transistor is configured to receive the $(n-1)^{th}$ scan driving signal.

6. The GOA circuit according to claim 1, wherein
the pull-up circuit unit comprises a second thin film transistor, a gate of the second thin film transistor connects with the first node, a drain of the second thin film transistor is configured to receive the clock signal, and a source of the second thin film transistor is configured to receive the $n^{th}$ scan driving signal.

7. The GOA circuit according to claim 1, wherein:
the pass-down circuit unit comprises a third thin film transistor, a gate of the third thin film transistor connects with the first node, a source of the third thin film transistor is configured to output the $n^{th}$ pass-down signal, and a drain of the third thin film transistor is configured to receive the clock signal.

8. The GOA circuit according to claim 1, wherein:
the pull-down circuit unit comprises a fourth thin film transistor and a fifth thin film transistor;
a gate of the fourth thin film transistor is configured to receive the $(n+1)^{th}$ scan driving, a source of the fourth thin film transistor is configured to receive the low power source, and a drain of the fourth thin film transistor is configured to receive the $n^{th}$ scan driving signal; and
a gate of the fifth thin film transistor is configured to receive the $(n+1)^{th}$ scan driving signal, a source of the fifth thin film transistor connects with the first node, and a drain of the fifth thin film transistor is configured to receive the low power source.

9. The GOA circuit according to claim 1, wherein:
the pull-down maintaining circuit unit comprises an inverter, a sixth thin film transistor, and a seventh thin film transistor;
one end of the inverter connects with the first node, another end of the inverter connects with a gate of the sixth thin film transistor and a gate of the seventh thin film transistor respectively;
a source of the sixth thin film transistor is configured to receive the low power source, and a drain of the sixth thin film transistor is configured to receive the $n^{th}$ scan driving signal; and
a source of the seventh thin film transistor is configured to receive the low power source, and a drain of the seventh thin film transistor connects with the first node.

* * * * *